(12) United States Patent  
Soda

(10) Patent No.: US 9,666,519 B2
(45) Date of Patent: May 30, 2017

(54) POWER SEMICONDUCTOR MODULE AND POWER UNIT

(71) Applicant: Mitsubishi Electric Corporation, Chiyoda-ku (JP)

(72) Inventor: Shinnosuke Soda, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/119,062

(22) PCT Filed: Nov. 5, 2014

(86) PCT No.: PCT/JP2014/079319
§ 371 (c)(1),
(2) Date: Aug. 15, 2016

(87) PCT Pub. No.: WO2015/125352
PCT Pub. Date: Aug. 27, 2015

(65) Prior Publication Data
US 2017/0053861 A1 Feb. 23, 2017

(30) Foreign Application Priority Data
Feb. 24, 2014 (JP) .................... 2014-033079

(51) Int. Cl.
*H01L 23/498* (2006.01)
*H01L 23/31* (2006.01)
(Continued)

(52) U.S. Cl.
CPC .... *H01L 23/49844* (2013.01); *H01L 23/3121* (2013.01); *H01L 23/49811* (2013.01);
(Continued)

(58) Field of Classification Search
None
See application file for complete search history.

(56) References Cited

U.S. PATENT DOCUMENTS

2008/0029911 A1* 2/2008 Jeon .................... H01L 23/3121
257/787
2014/0312514 A1* 10/2014 Yasunaga ............ H01L 23/3107
257/782

FOREIGN PATENT DOCUMENTS

JP 10-93016 A 4/1998
JP 2001-320185 A 11/2001
(Continued)

OTHER PUBLICATIONS

International Search Report Issued Dec. 9, 2014 in PCT/JP14/079319 filed Nov. 5, 2014.

*Primary Examiner* — Lex Malsawma
(74) *Attorney, Agent, or Firm* — Oblon, McClelland, Maier & Neustadt, L.L.P.

(57) ABSTRACT

A power semiconductor module includes: a plurality of semiconductor element substrates disposed on the same plane, each of which includes an insulating substrate with a front-side electrode formed on one of the surfaces of an insulator plate and a back-side electrode formed on the other surface of the insulator plate and a power semiconductor element fixed on a surface of the front-side electrode; and a wiring member that electrically connects with each other the semiconductor element substrates adjacent to each other; and the semiconductor element substrates and the wiring member are molded with mold resin; wherein the mold resin is provided with a recessed part, between the insulating substrates adjacent to each other, which is not filled with the resin constituting the mold resin to a predetermined depth from the side of the back-side electrode.

13 Claims, 14 Drawing Sheets

(51) Int. Cl.
*H01L 29/16* (2006.01)
*H01L 29/20* (2006.01)

(52) U.S. Cl.
CPC .... *H01L 23/49827* (2013.01); *H01L 29/1602* (2013.01); *H01L 29/1608* (2013.01); *H01L 29/2003* (2013.01)

(56) References Cited

FOREIGN PATENT DOCUMENTS

| | | | |
|---|---|---|---|
| JP | 2012-119618 A | 6/2012 | |
| JP | 2012-204366 A | 10/2012 | |
| JP | 2013-105882 A | 5/2013 | |

\* cited by examiner

A–A CROSS-SECTION

POWER SEMICONDUCTOR MODULE AND POWER UNIT

TECHNICAL FIELD

The present invention relates to amounting structure for power semiconductor modules that are built in power electronics equipment.

BACKGROUND ART

In a power semiconductor module, one power semiconductor element deals with a high power of several kilowatts; therefore, excessive thermal stress is repeatedly applied to upper and lower joints of the power semiconductor element due to heat generation by the element, thereby causing cracks in the joints formed of solder or the like. In order to enhance reliability of these upper and lower joints of the power semiconductor element, a technology of mold-sealing the entirety of the module with thermoplastic or thermosetting resin has been used. As a form of power semiconductor module using this mold-sealing technology, there is a power semiconductor module as shown in FIG. 14, in which an insulating substrate 10 includes a ceramic plate 1 with high thermal conductivity on which a front-side electrodes 2a and a back-side electrode 2b are formed, a power semiconductor element 3 is joined and wire-connected to the front-side electrode 2a, and the module including this insulating substrate is molded with mold resin 60.

In a power semiconductor module molded including the insulating substrate as described above, two sets of a diode and a switching element that are usually used in an inverter circuit are mounted in a two-in-one structure, thereby enabling the wire-connection to be completed within the mold, so that inductance can be reduced and its electrical characteristics can be enhanced. However, the front-side electrode 2a on the joint surface of the power semiconductor elements of the insulating substrate 10 is split and patterned into at least two parts as shown in FIG. 15, whereas the back-side electrode 2b on the back side is not split; therefore, stress in the front side is no longer balanced with that in the back side, resulting in an increase in warpage of the insulating substrate 10. If the warpage of the insulating substrate 10 increases, when a heatsink is connected to the power semiconductor module using grease, the power semiconductor module must be pressed onto the heatsink with excessive pressure in order to ensure their tight contact. If the power semiconductor module is pressed onto the heatsink with such excessive pressure as described above, shearing stress is applied between the mold resin 60 and the ceramic plate 1 and the front-side electrode 2a, thereby causing a problem that cracking and separation of the mold resin occur.

In coping with a problem with mold-sealing in a two-in-one structure such as the above, a method of splitting the insulating substrate into two parts so as to suppress its warpage has been proposed (see Patent document 1).

PRIOR ART DOCUMENT

Patent Document

Patent document 1: JP2012-119618A

SUMMARY OF THE INVENTION

Problem to be Solved by the Invention

In the power semiconductor module proposed in Patent document 1, warpage of the insulating substrates can be suppressed; however, when the module repeatedly undergoes thermal stress due to heat generation by its power semiconductor elements, the stress is concentrated between the insulating substrates disposed in the mold, thereby causing the mold resin and the ceramic plate to separate from each other in the vicinity between the insulating substrates. As a result, a problem has been that insulation along the ceramic plate surface is deteriorated and thereby the withstand voltage of the power semiconductor module will be lowered.

The present invention has been made to resolve the problem described above, and aims at providing a power semiconductor module that is resistant to repeated thermal stress and has high reliability.

Means for Solving the Problem

The present invention comprises: a plurality of semiconductor element substrates disposed on the same plane, each of which includes an insulating substrate with a front-side electrode formed on one of the surfaces of an insulator plate and a back-side electrode formed on the other surface of the insulator plate and a power semiconductor element fixed on a surface of the front-side electrode; and a wiring member that electrically connects with each other the semiconductor element substrates adjacent to each other; and the semiconductor element substrates and the wiring member are molded with mold resin in such a way that at least a plurality of back-side electrodes disposed is exposed over the entire surfaces thereof; wherein the mold resin is provided with a recessed part, between the insulating substrates adjacent to each other, which is not filled with the resin constituting the mold resin to a predetermined depth from the side of the back-side electrode.

Effect of the Invention

According to the present invention, a recessed part is provided between the insulating substrates, whereby there can be produced new remarkable effects, such as shearing stress between the mold resin and the insulating substrates is decreased when thermal stress is applied, and separation of the mold resin from the insulating substrates can be suppressed.

MODE FOR CARRYING OUT THE INVENTION

Embodiment 1

Figure 1:
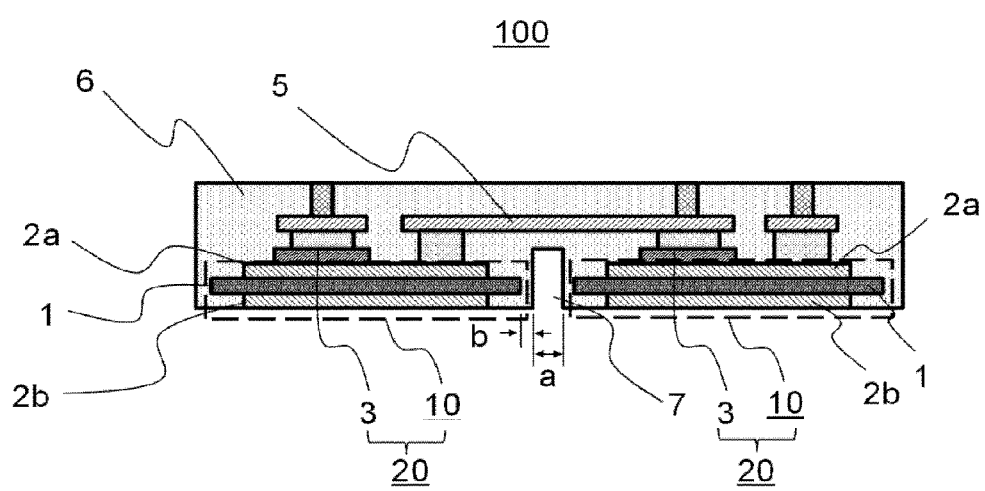
FIG. 1 is a side cross-sectional view showing a structure of a power semiconductor module according to Embodiment 1 of the present invention.

FIG. 1 is a cross-sectional view showing a structure of a power semiconductor module according to Embodiment 1 of the present invention. An insulating substrate 10 includes an insulator plate 1 that is a ceramic plate or the like made of aluminum nitride, onto both sides of which are joined a front-side electrode 2a and a back-side electrode 2b made of copper. A pair of insulating substrates 10 and 10 is provided, and an IGBT (insulated gate bipolar transistor) and an FWD (free-wheeling diode), which are a silicon power semiconductor element 3, are joined onto the surface of the front-side electrode 2a of each insulating substrate 10. The insulating substrate 10 onto which the power semiconductor element 3 is joined is hereinafter referred to as a semiconductor element substrate 20. As shown in FIG. 1, each semiconductor element substrate 20 is disposed on the same plane. FIG. 1 is a cross-sectional view, so only IGBTs are shown as the power semiconductor element 3. Additionally, the power semiconductor element is shown as exemplified by a Si semiconductor in this Embodiment 1; however a wide band gap semiconductor made of such material as SiC (silicon carbide), GaN-based (gallium nitride-based) material or diamond can be also applied to this power semiconductor element; there is no restriction to the type of power semiconductor elements. The wide band gap semiconductor can be operated in temperatures higher than the silicon semiconductor; therefore, if this invention is applied to the former, a particularly great effect can be produced. The front-side electrode 2a on one of the insulating substrates 10 and 10 is connected with an IGBT on the other insulating substrate 10 by a wiring member 5, that is, the semiconductor element substrates are electrically connected with each other, whereby a circuit for one phase of an inverter is constituted.

In order to ensure isolation of the surface along the insulator plate 1 and isolation between the front-side electrode 2a and the wiring member 5, the semiconductor element substrates 20 and 20 and the wiring member 5 are integrally mold-sealed with mold resin 6, such as thermosetting resin or thermoplastic resin. However, the back-side electrode 2b is exposed from the mold resin 6. The molding method therefor may be potting mold, transfer mold or the like; there is no restriction to the method. The mold-sealing not only produces an effect of increasing resistance to environmental stress and insulation, but also serves to reduce damage of the upper and lower joints of the power semiconductor elements due to repeated thermal stress and enhance operational reliability of the power semiconductor module. In this way, what is called a two-in-one-type power semiconductor module 100 can be structured, which constitutes a circuit for one phase of an inverter.

In the molded two-in-one-type power semiconductor module 100, the thermal expansion coefficient of the mold resin 6 is different from that of the insulator plate 1 or the front-side electrode 2a; therefore, when thermal shock is applied, there arises a problem that the mold resin 6 is separated from the insulator plate 1 and the front-side electrode 2a by thermal stress due to the difference in thermal expansion coefficient. In a typical example, the thermal expansion coefficient of the mold resin 6 is some 14 ppm, that of the insulator plate 1 is some 5 ppm and that of the front-side electrode 2a and the back-side electrode 2b is some 17 ppm; if a temperature change Δ of 70 degrees Kelvin occurs, when the portion between the insulating substrates is filled with the mold resin, a shearing stress of, for example, 100 MPa occurs between the mold resin 6 and the insulator plate 1 or the front-side electrode 2a, thereby causing such a problem as the mold resin 6 being separated and cracked.

Figure 2:
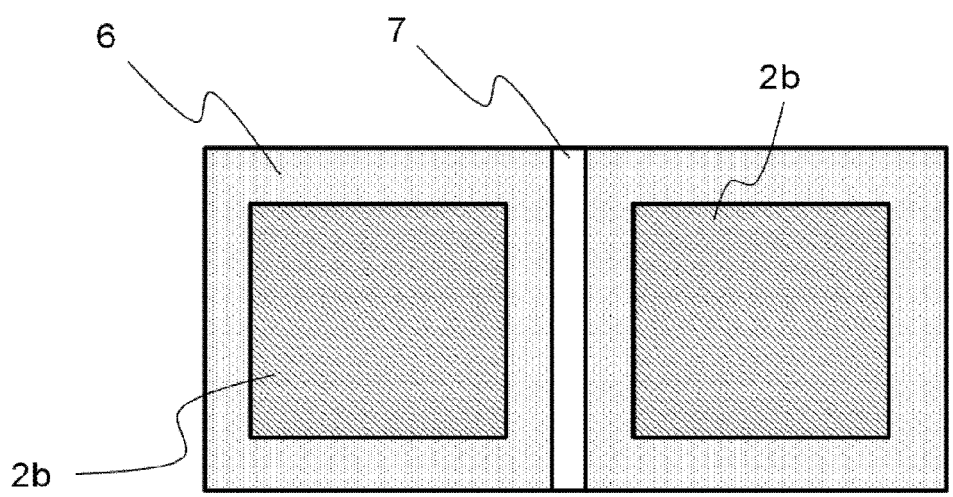
FIG. 2 is a bottom view looking at the bottom face of the power semiconductor module according to Embodiment 1 of the present invention.
Figure 13:
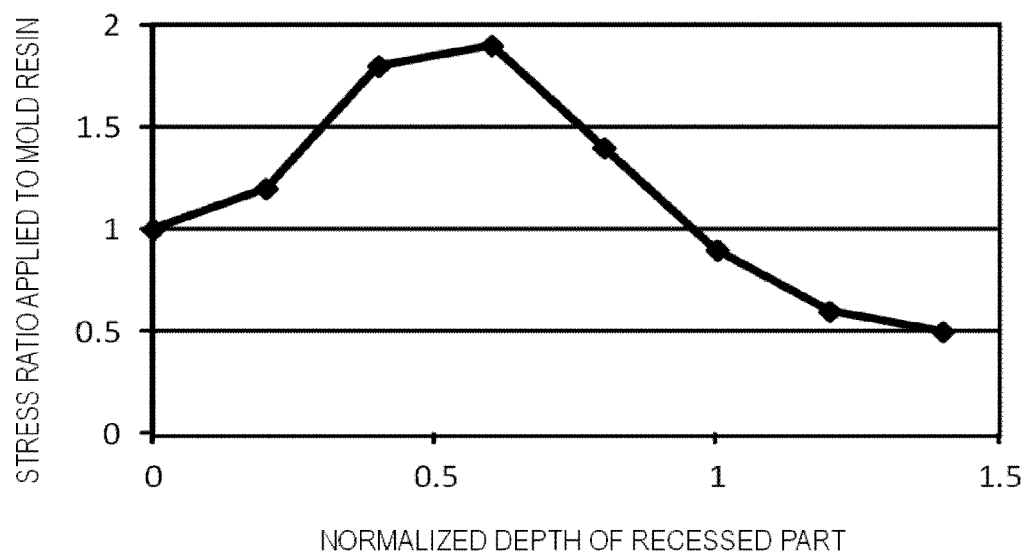
FIG. 13 is a view for explaining a function of the present invention.
Figure 14:
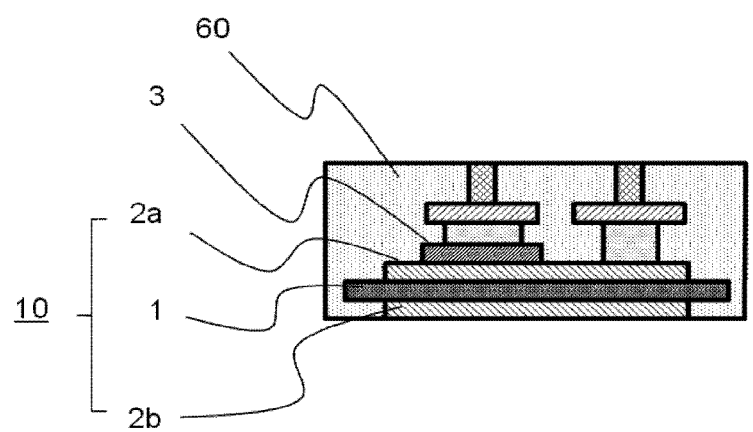
FIG. 14 is a side cross-sectional view showing a structure of a conventional power semiconductor module.
Figure 15:
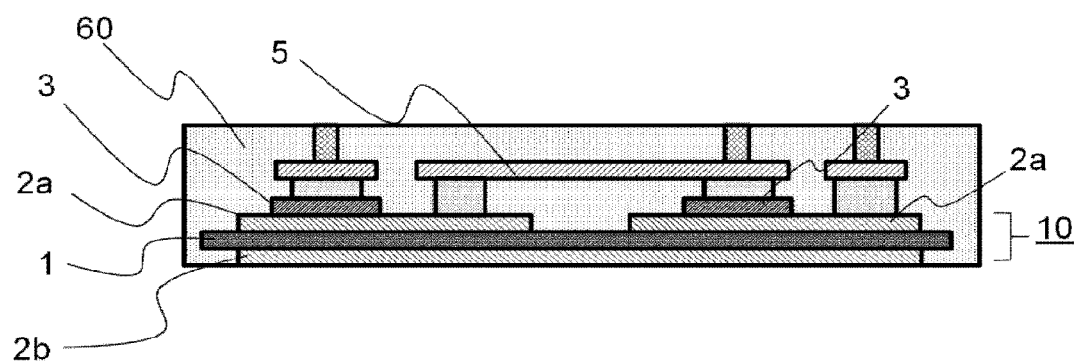
FIG. 15 is a side cross-sectional view showing another structure of the conventional power semiconductor module.

Therefore in this invention, a recessed part 7 that is not filled with the mold resin 6 is formed in a portion of the mold resin 6 between the insulating substrates where stress is concentrated. FIG. 2 is a bottom view looking at the bottom face of the power semiconductor module in FIG. 1. The recessed part 7 is formed in a slit shape as shown in FIG. 2. The recessed part 7 is typically formed to a depth deeper than the same plane as the joint surface of the power semiconductor element on the insulating substrate. FIG. 13 is a graph for explaining the function of the recessed part according to the present invention, which is a diagram showing the relationship between the depth of the recessed part normalized by the depth to the joint surface of the power semiconductor element and stress applied to the mold resin in the vicinity of the insulating substrates. As shown in FIG. 13, when the normalized depth of the recessed part is smaller than one, that is, when the depth of the recessed part is shallower than that of the joint surface of the power semiconductor element, stress concentration occurs between the ceramic plates and the bottom face of the recessed part, and stress increases compared to the case when the recessed part is not formed (the normalized depth of the recessed part being zero). When the normalized depth of the recessed part is greater than one, that is, when the depth of the recessed part becomes the same as that of the joint surface of the power semiconductor element or exceeds that, stress can be decreased compared to the case when the recessed part is not formed. That is to say, if the recessed part 7 is not at least deep enough to reach the joint surface of the power semiconductor element, which is the position of the upper surface of the front-side electrode 2a, an effect of alleviating stress will not be produced. As seen from the above, the depth of the recessed part 7 needs to be greater than the total thickness of the back-side electrode 2b, the insulator plate 1 and the front-side electrode 2a, that is, the entire thickness of the insulating substrate 10. The recessed part 7 is formed by a method through design of the mold die, or it may be formed by disposing at the position of the recessed part a mold member made of metal or fluorine resin so that the part is not filled with the mold resin. There is also a method of forming the recessed part by laser machining and the like after the part is filled with the mold resin; however, this is not preferable from the point of productivity.

According to a structure as described above, the recessed part 7 that is not filled with the mold resin 6 is formed between the insulating substrate 10 and another insulating substrate 10 adjacent to this insulating substrate 10, whereby shearing stress under thermal shock can be decreased between the surface along the insulator plate 1 and the mold resin 6 and between the front-side electrode 2a and the mold resin 6, so that separation of the mold resin 6 can be suppressed. In a typical example, when the temperature change is 70 degrees Kelvin, shearing stress between the mold resin 6 between the insulating substrate 10 and another insulating substrate 10 adjacent to each other and the insulator plate 1 or the front-side electrode 2a can be decreased to, for example, 20 MPa, compared to 100 MPa when the recessed part 7 is not formed. In this case, since the adhesive strength of the mold resin 6 exceeds the shearing stress, separation of the mold resin 6 from the insulator plate 1 or the front-side electrode 2a does not occur.

The power semiconductor module is required to be miniaturized as much as possible, so the narrower the width a of the slit-shaped recessed part 7 is, the more favorable it is. Also, the shorter the distance b between the recessed part 7 and the insulating substrate 10 is, the more favorable it is from a miniaturization point of view. Typically, the width a of the recessed part 7 is 10 μm to 5 mm and the distance b between the recessed part 7 and the insulating substrate 10 is also 10 μm to 5 mm. However, even if the distance b becomes 0 μm, that is, the insulator plate 1 is exposed to inside the recessed part 7, the effect by this invention will not be lost. In order to ease release of the power semiconductor module from the mold die after molded, side faces of the recessed part 7 may be tapered.

Moreover, the recessed part 7 may be formed not in a single slit but in two or more lines of slits. The interior of the recessed part 7 may be in the atmosphere, or filled with material, such as gel, other than the resin constituting the mold resin 6, which is softer than the mold resin 6. If the interior of the recessed part 7 is filled with gel or the like, deterioration of the insulation resistance can be alleviated thanks to insulation by the gel, when cracks of the mold resin occur.

By suitably providing the recessed part 7 taking into consideration stress conditions, an effect of reducing warpage of the power semiconductor module can be also produced. If warpage of the power semiconductor module is reduced, tight contact between the power semiconductor module and its heatsink will be ensured, and as a result, not only its cooling capacity can be increased but also operational reliability can be enhanced.

In addition, by forming the recessed part 7, usage of the mold resin can be reduced. A reduction in usage of the mold resin can produce an effect of reducing costs and weight.

Embodiment 2

Figure 3:
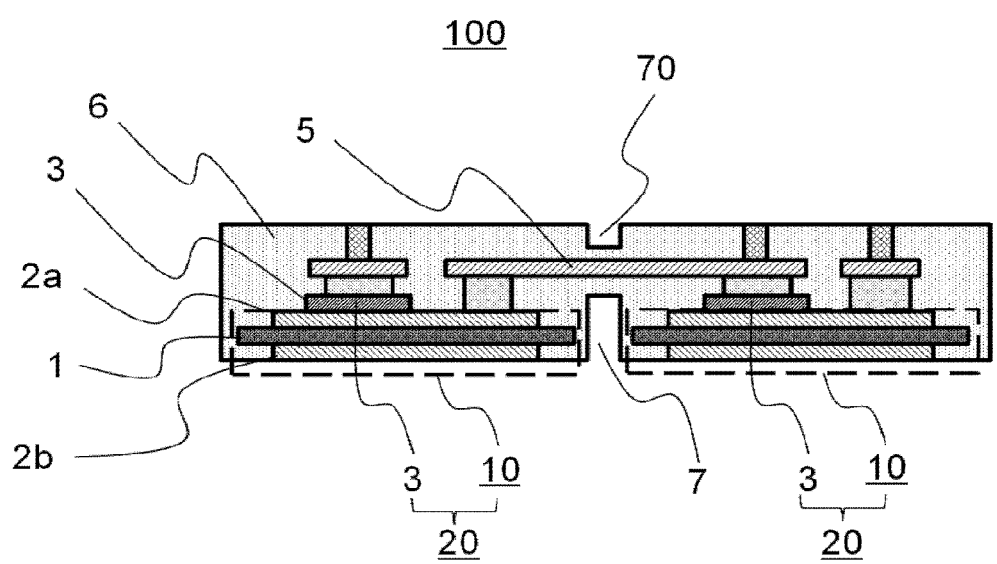
FIG. 3 is a side cross-sectional view showing a structure of a power semiconductor module according to Embodiment 2 of the present invention.

FIG. 3 is a cross-sectional view showing a structure of a power semiconductor module according to Embodiment 2 of the present invention. As shown in FIG. 3, a second recessed part 70 may be also provided in a portion of the mold resin 6 above the wiring member 5. When the recessed part 7 is provided only between the insulating substrates 10 and 10 adjacent to each other as in Embodiment 1, stress becomes unbalanced in portions above and under the wiring member, which will cause danger that the power semiconductor module might warp. According to the structure of this Embodiment 2, stress imbalance in the vicinity of the wiring member 5 caused by the recessed part 7 formed between the insulating substrates 10 and 10 adjacent to each other can be corrected by the second recessed part 70 formed in the portion of the mold resin 6 above the wiring member 5, so that warpage of the power semiconductor module 100 can be reduced.

The second recessed part 70 does not need to be formed in the same shape as the recessed part 7. In order to eliminate the stress imbalance, the second recessed part 70 may be made wider than the recessed part 7. The method of forming the second recessed part 70 may be the same as or different from that of forming the recessed part 7; there is no restriction to the method of forming those recessed parts.

Embodiment 3

Figure 4:
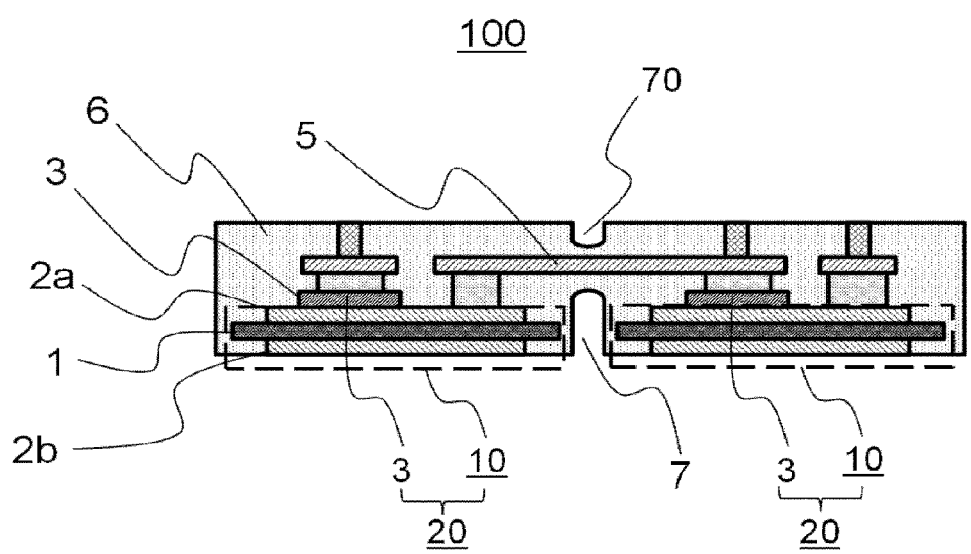
FIG. 4 is a side cross-sectional view showing a structure of a power semiconductor module according to Embodiment 3 of the present invention.

FIG. 4 is a cross-sectional view showing a structure of a power semiconductor module according to Embodiment 3 of the present invention. When stress is applied to the power semiconductor module in Embodiment 1, since the bottom face of the recessed part is shaped in a rectangle, the stress is concentrated at the corners thereof, thereby causing a problem that cracks of the mold resin 6 occur from the bottom face of the recessed part. If cracks by which the wiring member 5 and the front-side electrode 2a are exposed from the mold resin 6 are formed in this case, voids that are not filled with the mold resin are created between the wiring member 5 and the front-side electrode 2a attributable to the recessed part, and from which originates an electrical leakage path, thereby deteriorating insulation resistance of the power semiconductor module.

In order to avoid this problem, the bottom face of the recessed part 7 and that of the recessed part 70 may be formed in a curved shape as shown in FIG. 4. The bottom faces do not need to be formed in a curved shape over their entire faces, but only have to be formed in such a way that connecting parts of the side faces of the recessed parts with the bottom faces thereof are curved with a curvature R. By structuring in this way, stress can be prevented from concentrating at the connecting parts of the side faces of the recessed parts with their respective bottom faces, so that cracks of the mold resin in the bottom faces of the recessed parts can be suppressed. Additionally, it goes without saying that the idea of forming the connecting parts of the side faces of the recessed part with the bottom face in a curved shape can be also applied to the recessed part of Embodiment 1 and those of Embodiments 4 to 7 described later.

Embodiment 4

Figure 5:
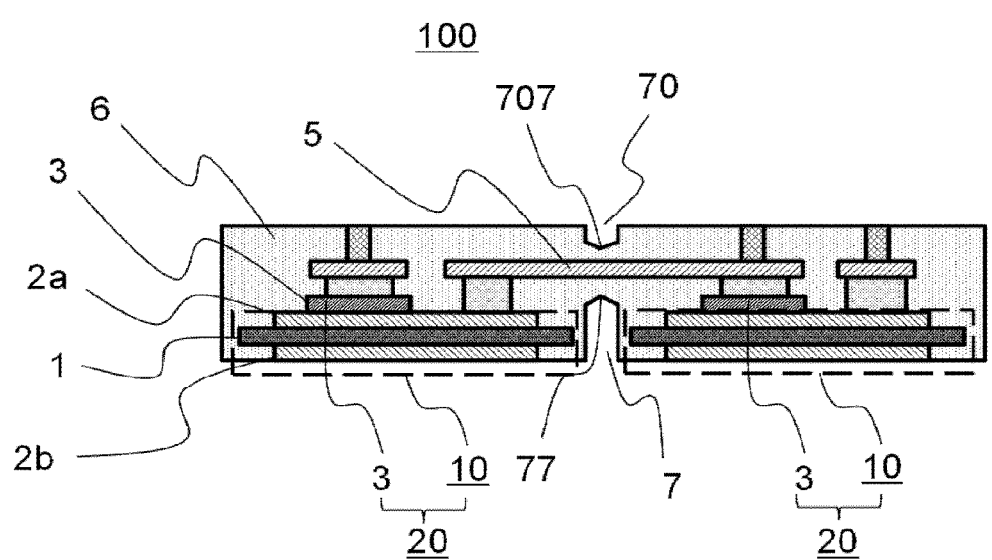
FIG. 5 is a side cross-sectional view showing a structure of a power semiconductor module according to Embodiment 4 of the present invention.

FIG. 5 is a cross-sectional view showing a structure of a power semiconductor module according to Embodiment of the present invention. In Embodiment 3, when extraordinary high stress is applied to the power semiconductor module, there is danger that cracks might occur in the mold resin of the bottom faces of the recessed parts even if stress concentration does not occur at the corners of the bottom faces of the recessed parts formed in the mold resin, and an electrical leakage path linking the wiring member with the front-side electrode might be created, so that insulation of the power semiconductor module would be deteriorated.

Figure 6:
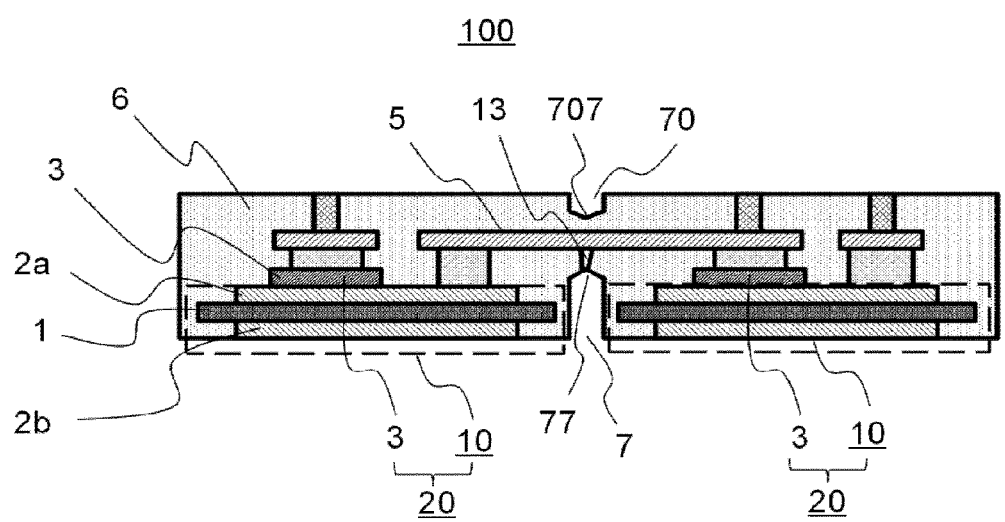
FIG. 6 is a side cross-sectional view for explaining an effect by the power semiconductor module according to Embodiment 4 of the present invention.

In order to avoid such a problem as described above, the bottom faces of the recessed part 7 and the second recessed part 70, as shown in FIG. 5, may be further recessed and formed in a wedge shape having tip parts 77 and 707, respectively. According to a structure as described above, even if a crack occurs in the mold resin in the bottom face of the recessed part, the crack 13 of the bottom face of the recessed part, as shown in FIG. 6, can be restricted so as to occur from the tip part and grow in the directions perpendicular to the insulating substrates, that is, the direction toward the wring member 5. Therefore, any crack does not occur from the bottom face of the recessed part toward the perimeter of the front-side electrode 2a, and insulation between the wring member 5 and the front-side electrode 2a is ensured, so that serious failure of the power semiconductor module can be prevented.

Figure 7:
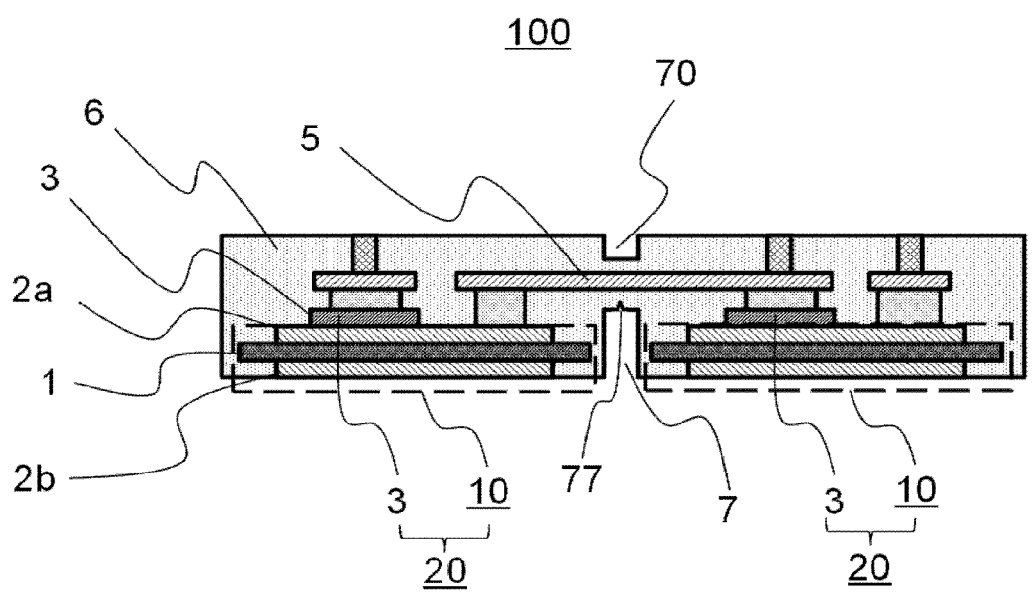
FIG. 7 is a side cross-sectional view showing another structure of the power semiconductor module according to Embodiment 4 of the present invention.

The wedge on the bottom faces of the recessed parts may be formed in a shape with multiple wedges. Moreover, the bottom face of the recessed part is not formed in a wedge shape, but as shown in FIG. 7, it may be provided with the tip part 77 that is a pin-shaped recess on a flat bottom face, as far as the same effect as enabling cracking directions of the mold resin from the bottom face of the recessed part to be fixed can be produced. Furthermore, when the second recessed part 70 is provided other than the recessed part 7, in order to prevent any crack from extending toward the insulating substrate side, the tip part only has to be provided at least in the recessed part 7.

Embodiment 5

Figure 8A:
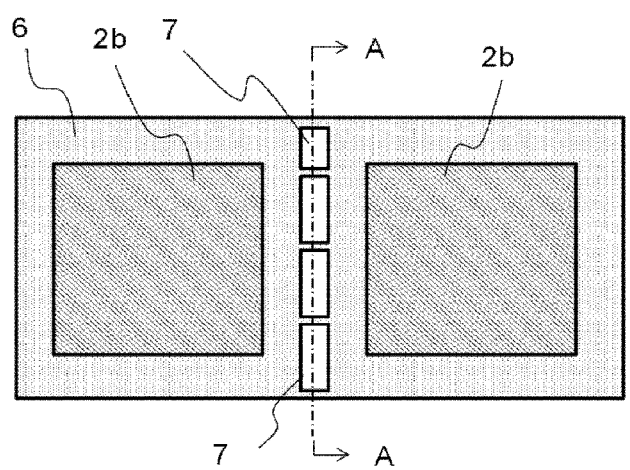
FIG. 8A and FIG. 8B are a bottom view and a cross-sectional view, looking at the bottom face of a power semiconductor module according to Embodiment 5 of the present invention.
Figure 8B:
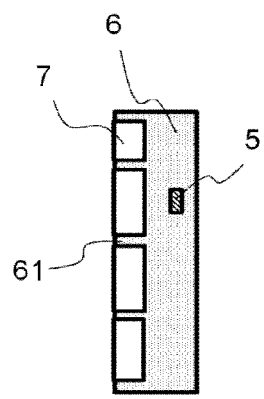

FIG. 8A is a bottom view looking at the bottom face of a power semiconductor module according to Embodiment 5 of the present invention; FIG. 8B is a cross-sectional view along the A-A line of FIG. 8A. In the power semiconductor module of Embodiment 1, the recessed part 7 is, as shown in FIG. 2, formed in a shape of a single slit; however, when the recessed part 7 is formed in the shape of a single slit as the above, the portion of the recessed part 7 will be structured of only thin mold resin and the wiring member, so its flexural rigidity will be lowered, thereby causing a problem that warpage of the power semiconductor module increases due to bending of this portion of the recessed part 7.

In order to cope with this problem, the recessed part 7 may be formed, as shown in FIG. 8, in such a way that a plurality of slits is arranged in a line along the perimeter of the insulating substrates. By structuring in this way, portions between the slits that do not form the recessed part function as an anchor, thereby suppressing bending of the wiring member, so that warpage of the power semiconductor module can be reduced. The intervals at which the slits are arranged may be unequal. Moreover, as shown in the A-A cross-sectional view of FIG. 8B, portions 61 that do not serve as the recessed part 7 but serve as the anchor are preferably located in positions where the wiring member does not exist. If the portions are not located just under the wiring member 5, any leakage path between the wiring member 5 and the front-side electrode 2a will not be created even if cracks of the mold resin occur at the anchor portions; therefore, the insulation resistance of the power semiconductor module becomes difficult to be deteriorated.

Furthermore, when the recessed part 7 is formed in the shape of a single slit as shown in Embodiment 1, the fluidity of the mold resin in molding is worsened between the mold die and the insulating substrates; therefore, voids are likely to be formed in the mold. If voids are formed in the mold, the insulation resistance of the power semiconductor module will be lost. In coping with this problem, if the recessed part 7 is formed with a plurality of slits arranged in a line as shown in FIGS. 8A and 8B, the filling property of the mold resin will be improved between the mold die and the insulating substrates, so that voids become difficult to be formed in the mold. That is to say, a power semiconductor module with high insulation resistance can be fabricated.

Embodiment 6

Figure 9:
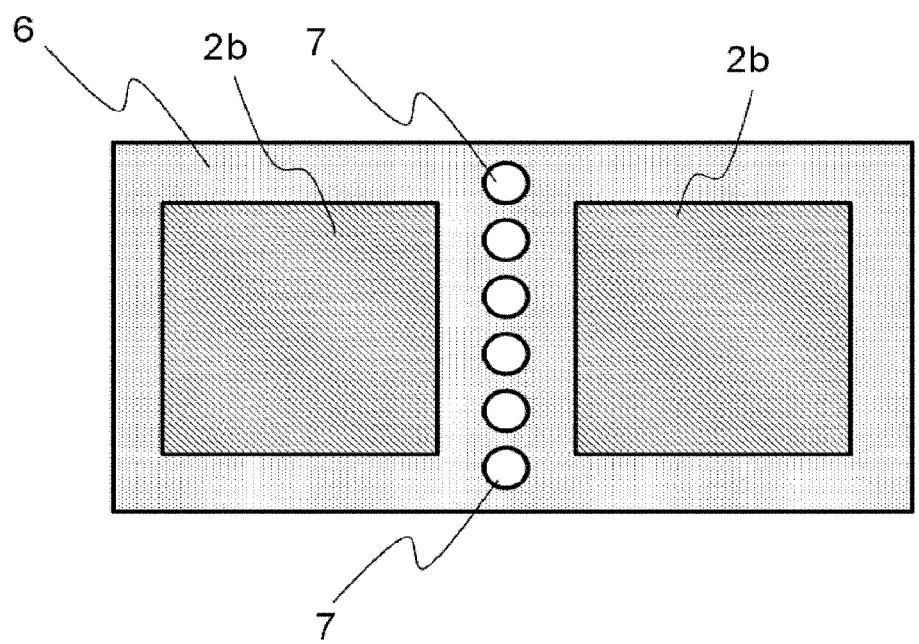
FIG. 9 is a bottom view looking at the bottom face of a power semiconductor module according to Embodiment 6 of the present invention.
Figure 10:
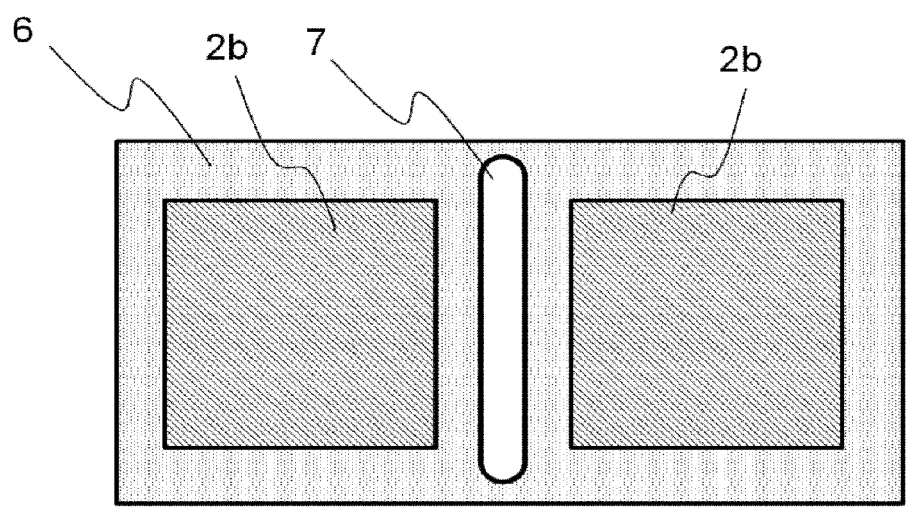
FIG. 10 is a bottom view looking at the bottom face of another power semiconductor module according to Embodiment 6 of the present invention.

FIG. 9 is a bottom view looking at the bottom face of a power semiconductor module according to Embodiment 6 of the present invention. As shown in FIG. 9, the recessed part 7 may be formed with a plurality of holes having a circular cross section arranged in a line. Furthermore, side faces of end portions of the slit-shaped recessed part 7 may be formed in an arc shape as shown in FIG. 10. Moreover, side faces of end portions of each slit of FIGS. 8A and 8B explained in Embodiment 5 may also be formed in an arc shape. The cross-section of the holes and the arc shape of the end portions of the slit do not need to be a near-perfect circle, but side faces of the holes and the slit end portions only have to be formed in a curve without any corner.

As described above, corners are removed from the side faces of the recessed part by forming the side faces of the recessed part in a curve without any corner or in a combination of a plane and a curve; therefore, stress is not concentrated in the mold resin even if the recessed part is provided, so that crack occurrence in the mold resin can be suppressed.

Moreover, by making the side faces of the recessed part those without any corner as shown in FIGS. 9 and 10, the filling property of the mold resin will be improved between the mold die and the insulating substrates, thereby suppressing void occurrence in the mold.

Embodiment 7

Figure 11:
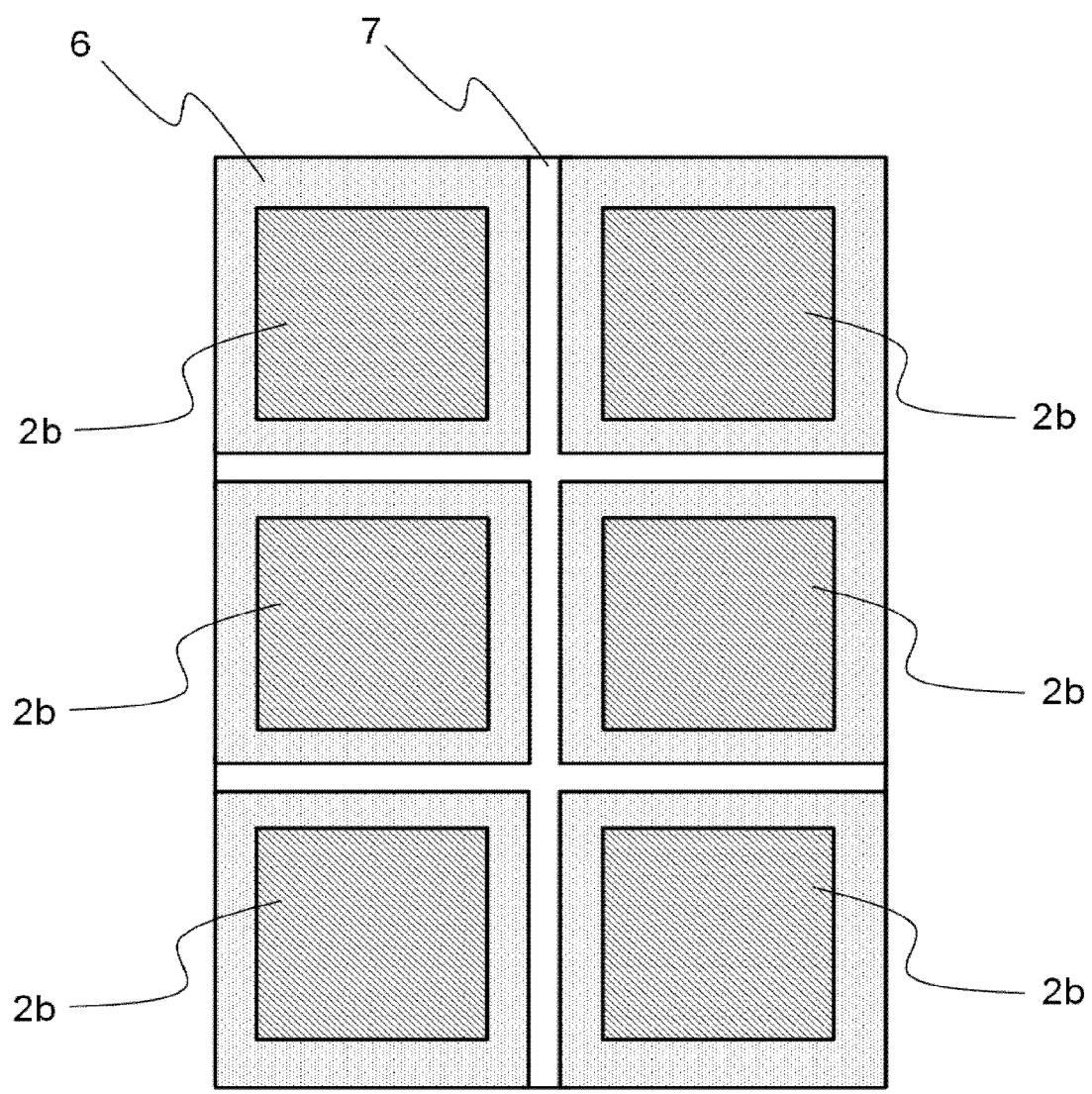
FIG. 11 is a bottom view looking at the bottom face of a power semiconductor module according to Embodiment 7 of the present invention.

FIG. 11 is a bottom view looking at the bottom face of a power semiconductor module according to Embodiment of the present invention. The number of insulating substrates is not limited to two, but may be three or more. For example, six insulating substrates may be disposed as shown in FIG. 11 so as to form a six-in-one-type power semiconductor module, and the recessed part 7 may be formed between their respective insulating substrates. The recessed part 7 does not need to be formed in a uniform size nor arranged in a straight line, but when the insulating substrates are different in shape from each other, the mold die is designed so that the recessed part 7 can be formed in accordance with the shape of space between insulating substrates adjacent to each other.

By structuring as described above, it becomes possible to integrally mold power units for a three-phase inverter with U, V and W output terminals. If these power units with three-phase output terminals are integrally molded, there can be produced such effects as parasitic inductance can be decreased by completing wiring within the mold, thereby enhancing electric characteristics, and assembly processes can be decreased, thereby cutting down its manufacturing costs.

Embodiment 8

Figure 12:
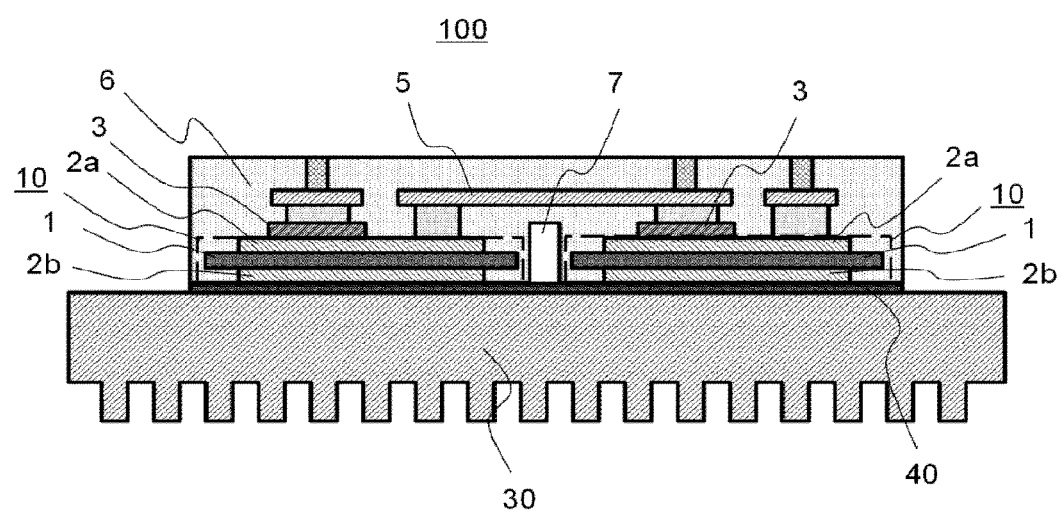
FIG. 12 is a side cross-sectional view showing a structure of a power unit according to Embodiment 8 of the present invention.

FIG. 12 is a cross-sectional view showing a structure of a power unit according to Embodiment 8 of the present invention. As shown in FIG. 12, the power semiconductor module 100 according to the present invention is provided with a heatsink 30 via a contact member 40 on the side of the back-side electrode 2b, so as to dissipate heat generated in the power semiconductor module 100, whereby this module can be used as a power unit. A plurality of power units as described above is integrally used, which can be applied to inverters of railway vehicles and hybrid cars.

Here, when the contact member 40 used between the power semiconductor module 100 and the heatsink 30 is not grease but rigid material such as solder, a power semiconductor module using the conventional technology undergoes high thermal stress due to difference in thermal expansion coefficient between the power semiconductor module and the heatsink, so that separation of the insulating substrates from the mold resin would seriously develop.

If the structure according to the present invention is applied to this problem, separation and cracking of the mold resin between the insulating substrates 10 and 10 can be suppressed, so that reliability of the power unit can be enhanced.

Moreover, when the back-side electrode 2b of the power semiconductor module 100 is joined with the heatsink 30 using rigid material such as solder, the flexural rigidity of the power semiconductor module will be lowered as a whole if the structure according to this invention is applied. Therefore, when thermal impact is applied, stress applied to the joint between the power semiconductor module and the heatsink can be decreased, compared to the conventional structure provided with no recessed part. Therefore, since an increase in thermal resistance due to damage of the joint can be suppressed, an effect of enhancing operational reliability of the power unit can be also produced.

Additionally, each of the embodiments of this invention can be freely combined or suitably altered, or the structural requirements thereof can be deleted without departing from the scope of the invention.

DESCRIPTION OF THE REFERENCE NUMERALS

1: insulator plate, 2a: front-side electrode, 2b: back-side electrode, 3: power semiconductor element, 5: wiring member, 6: mold resin, 7: recessed part, 10: insulating substrate, 20: semiconductor element substrate, 30: heatsink, 70: second recessed part, 77 and 707: tip part, 100: power semiconductor module

The invention claimed is:

1. A power semiconductor module, comprising:
a plurality of semiconductor element substrates disposed on the same plane, each of which includes an insulating substrate with a front-side electrode formed on one of the surfaces of an insulator plate and a back-side electrode formed on the other surface of the insulator plate and a power semiconductor element fixed on a surface of the front-side electrode; and
a wiring member that electrically connects with each other the semiconductor element substrates adjacent to each other;
the semiconductor element substrates and the wiring member being molded with mold resin in such a way that at least a plurality of back-side electrodes disposed is exposed over the entire surfaces thereof; wherein
the mold resin is provided with a recessed part, between the insulating substrates adjacent to each other, which is not filled with the resin constituting the mold resin to a predetermined depth from the side of the back-side electrode.

2. A power semiconductor module according to claim 1, wherein the predetermined depth is greater than the thickness of the insulating substrate.

3. A power semiconductor module according to claim 1, wherein the recessed part is formed of a slit.

4. A power semiconductor module according to claim 3, wherein an end side face of the slit is formed in a curved shape.

5. A power semiconductor module according to claim 1, wherein a plurality of slits is arranged in a line to form the recessed part.

6. A power semiconductor module according to claim 5, wherein an end side face of the slits is formed in a curved shape.

7. A power semiconductor module according to claim 1, wherein a plurality of holes whose side face is formed in a curved shape is arranged to form the recessed part.

8. A power semiconductor module according to claim 1, wherein a connecting part between a side face and a bottom face of the recessed part is formed in a curved shape.

9. A power semiconductor module according to claim 1, wherein a further-recessed tip part is provided on a bottom face of the recessed part.

10. A power semiconductor module according to claim 1, wherein a second recessed part is provided toward the side of the back-side electrode from the surface of the mold resin in the opposite side of the back-side electrode.

11. A power semiconductor module according to claim 1, wherein the power semiconductor element is made of a wide band gap semiconductor.

12. A power semiconductor module according to claim 11, wherein the wide band gap semiconductor is a semiconductor made of silicon carbide, gallium nitride-based material or diamond.

13. A power unit, comprising a heatsink provided in the side of the back-side electrode of a power semiconductor module according to claim 1.

* * * * *